US012727489B2

(12) United States Patent
Scharf et al.

(10) Patent No.: US 12,727,489 B2
(45) Date of Patent: Sep. 1, 2026

(54) SEMICONDUCTOR DEVICES INCLUDING A PREMOLDED LEADFRAME AND A SEMICONDUCTOR PACKAGE

(71) Applicant: Infineon Technologies AG, Neubiberg (DE)

(72) Inventors: Thorsten Scharf, Lappersdorf (DE); Josef Höglauer, Kirchheim-Heimstetten (DE); Angela Kessler, Sinzing (DE); Claus Waechter, Sinzing (DE)

(73) Assignee: Infineon Technologies AG, Neubiberg (DE)

(*) Notice: Subject to any disclaimer, the term of this patent is extended or adjusted under 35 U.S.C. 154(b) by 712 days.

(21) Appl. No.: 18/082,238

(22) Filed: Dec. 15, 2022

(65) Prior Publication Data

US 2023/0197577 A1 Jun. 22, 2023

(30) Foreign Application Priority Data

Dec. 17, 2021 (DE) ......................... 102021133665.1

(51) Int. Cl.
*H10W 70/40* (2026.01)
*H10W 74/10* (2026.01)
*H10W 90/00* (2026.01)

(52) U.S. Cl.
CPC ....... *H10W 70/421* (2026.01); *H10W 70/451* (2026.01); *H10W 74/111* (2026.01); *H10W 90/00* (2026.01)

(58) Field of Classification Search
None
See application file for complete search history.

(56) References Cited

U.S. PATENT DOCUMENTS 7,245,007 B1 * 7/2007 Foster ..................... H01L 24/49 257/E23.047
7,554,179 B2 * 6/2009 Shim ................. H01L 23/49537 257/676
8,618,641 B2 * 12/2013 Chan ....................... H01L 24/85 257/676
9,305,872 B2 4/2016 Lopez et al.
11,244,906 B2 * 2/2022 Huang .................... H01L 25/50
11,315,891 B2 * 4/2022 Tsai ....................... H01Q 23/00
12,113,022 B2 * 10/2024 Tseng .................. H01L 23/5385
2004/0104489 A1 6/2004 Larking (Continued)

FOREIGN PATENT DOCUMENTS

JP 2008205083 A 9/2008

*Primary Examiner* — Long Pham
(74) *Attorney, Agent, or Firm* — Murphy, Bilak & Homiller, PLLC

(57) ABSTRACT

A semiconductor device includes a premolded leadframe, including a main surface, at least one electrical contact extending out of the main surface, and an opposite main surface arranged opposite to the main surface. The semiconductor device further includes a semiconductor package arranged on the main surface and laterally displaced to the at least one electrical contact of the premolded leadframe. The semiconductor package includes a semiconductor chip and at least one electrical contact. Surfaces of the at least one electrical contact of the premolded leadframe and the at least one electrical contact of the semiconductor package facing away from the main surface are flush.

23 Claims, 5 Drawing Sheets

(56) References Cited

U.S. PATENT DOCUMENTS

| | | | | |
|---|---|---|---|---|
| 2012/0175768 | A1* | 7/2012 | Saito | H01L 23/49524 257/E23.06 |
| 2013/0213704 | A1 | 8/2013 | Lu et al. | |
| 2017/0025340 | A1* | 1/2017 | Padmanabhan | H01L 23/49568 |
| 2021/0327829 | A1* | 10/2021 | Sridharan | H01L 24/28 |
| 2021/0366833 | A1* | 11/2021 | Huang | H01L 23/3121 |

* cited by examiner z
y
x
22

24
22

26
22

26
30
28
30

26
30

32
26
30

6
52
12
34
10
8
36
10
36
10

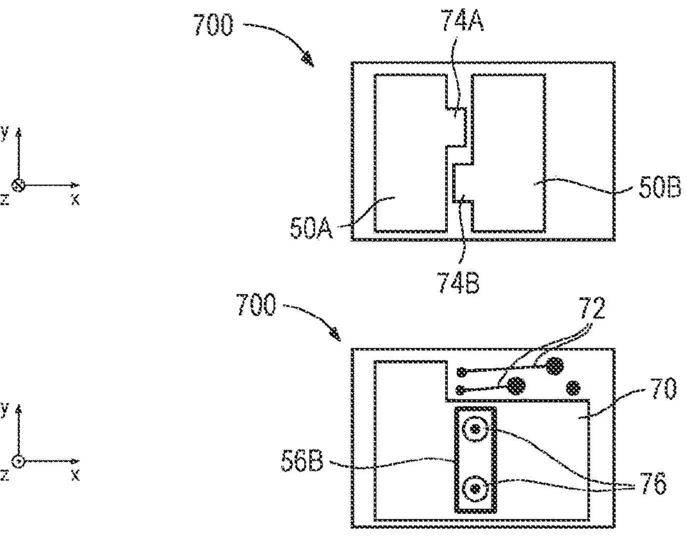
Fig. 7A
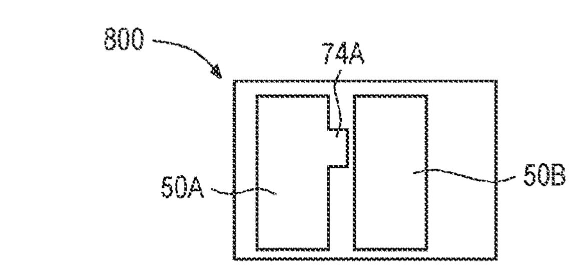
Fig. 7B
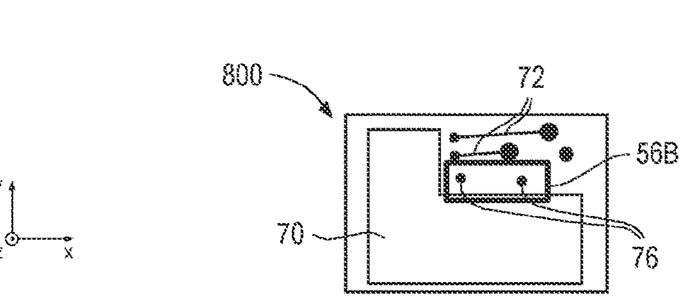
Fig. 8A
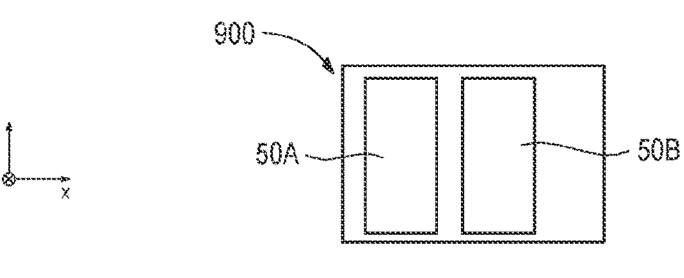
Fig. 8B
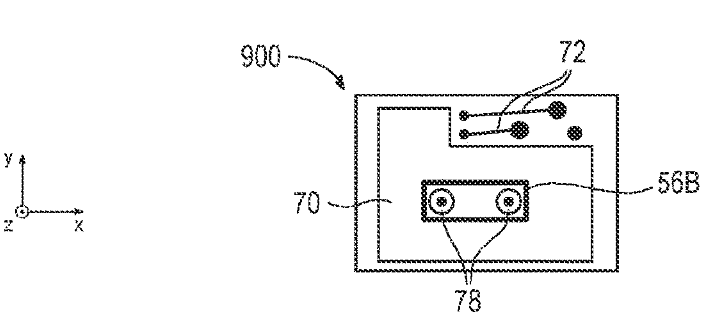
Fig. 9A
Fig. 9B

SEMICONDUCTOR DEVICES INCLUDING A PREMOLDED LEADFRAME AND A SEMICONDUCTOR PACKAGE

TECHNICAL FIELD

The present disclosure relates to semiconductor devices including a premolded leadframe and a semiconductor package. In addition, the present disclosure relates to methods for manufacturing such semiconductor devices.

BACKGROUND

Various types of semiconductor devices may be used in various types of applications. For example, DC-DC converters may be used in server applications and in this regard may need to be very size efficient. Some conventional DC-DC converters may include integrated half bridges and passive electronic components arranged in a side by side manner on a printed circuit board. Other conventional devices may be leadframe based QFN (Quad Flat No Leads) packages. In still further conventional devices, an included semiconductor package may be embedded in a printed circuit board. All of these known solutions may suffer from an increased size of the device and an increased requirement of board area. Manufacturers and developers of semiconductor devices are constantly striving to improve their products. In particular, it may be desirable to provide semiconductor devices with reduced space requirements. In addition, it may be desirable to provide methods for manufacturing such semiconductor devices.

SUMMARY

An aspect of the present disclosure relates to a semiconductor device. The semiconductor device comprises a premolded leadframe, comprising a main surface, at least one electrical contact extending out of the main surface, and an opposite main surface arranged opposite to the main surface. The semiconductor device further comprises a semiconductor package arranged on the main surface and laterally displaced to the at least one electrical contact of the premolded leadframe. The semiconductor package comprises a semiconductor chip and at least one electrical contact. Surfaces of the at least one electrical contact of the premolded leadframe and the at least one electrical contact of the semiconductor package facing away from the main surface are flush.

An aspect of the present disclosure relates to a method for manufacturing a semiconductor device. The method comprises providing a premolded leadframe, comprising a main surface, at least one electrical contact extending out of the main surface, and an opposite main surface arranged opposite to the main surface. The method further comprises arranging a semiconductor package on the main surface and laterally displaced to the at least one electrical contact of the premolded leadframe. The semiconductor package comprises a semiconductor chip and at least one electrical contact. Surfaces of the at least one electrical contact of the premolded leadframe and the at least one electrical contact of the semiconductor package facing away from the main surface are flush.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIGS. 7A and 7B schematically illustrating a bottom view and a top view of a semiconductor package 700 which may be included in a semiconductor device in accordance with the disclosure.

FIGS. 8A and 8B schematically illustrating a bottom view and a top view of a semiconductor package 800 which may be included in a semiconductor device in accordance with the disclosure.

FIGS. 9A and 9B schematically illustrating a bottom view and a top view of a semiconductor package 900 which may be included in a semiconductor device in accordance with the disclosure.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
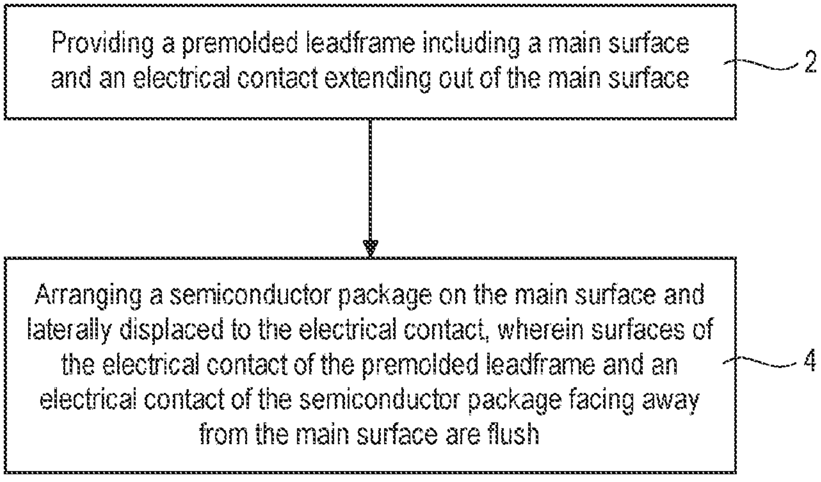
FIG. 1 illustrates a flowchart of a method for manufacturing a semiconductor device in accordance with the disclosure.

FIG. 1 illustrates a flowchart of a method for manufacturing a semiconductor device in accordance with the disclosure. It is to be noted that the method is described in a general manner in order to qualitatively specify aspects of the disclosure. The method may include further aspects. For example, the method may be extended by any of the aspects described in connection with other examples in accordance with the disclosure. In particular, the method of FIG. 1 may be extended by any of the aspects described in connection with the method of FIG. 3 described later on.

At 2, a premolded leadframe may be provided. The premolded leadframe may include a main surface, at least one electrical contact extending out of the main surface, and an opposite main surface arranged opposite to the main surface. At 4, a semiconductor package may be arranged on the main surface and laterally displaced to the at least one electrical contact of the premolded leadframe. The semiconductor package may include a semiconductor chip and at least one electrical contact. Surfaces of the at least one electrical contact of the premolded leadframe and the at least one electrical contact of the semiconductor package facing away from the main surface may be flush.

Figure 2:
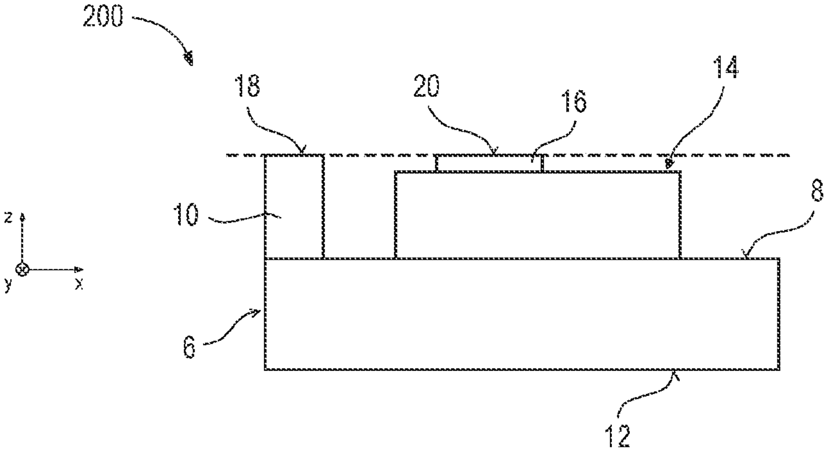
FIG. 2 schematically illustrates a cross-sectional side view of a semiconductor device 200 in accordance with the disclosure.

FIG. 2 schematically illustrates a cross-sectional side view of a semiconductor device 200 in accordance with the disclosure. For example, the semiconductor device 200 may be manufactured based on The method of FIG. 1. It is to be noted that the semiconductor device 200 is described in a general manner in order to qualitatively specify aspects of the disclosure. The semiconductor device 200 may include further aspects. For example, the semiconductor device 200 may be extended by any of the aspects described in connection with other examples in accordance with the disclosure. In particular, the semiconductor device 200 may be extended by any of the aspects described in connection with the semiconductor device 300 manufactured based on the method of FIG. 3 described later on.

The semiconductor device 200 may include a premolded leadframe 6. The premolded leadframe 6 may include a main surface 8, at least one electrical contact 10 extending out of the main surface 8, and an opposite main surface 12 arranged opposite to the main surface 8. The semiconductor device 200 may further include a semiconductor package 14 which may be arranged on the main surface 8 and laterally displaced to the at least one electrical contact 10 of the premolded leadframe 6. The semiconductor package 14 may include a semiconductor chip and at least one electrical contact 16. In the example of FIG. 2, the semiconductor chip of The semiconductor package 14 is not illustrated for the sake of simplicity. A surface 18 of the at least one electrical contact 10 of the premolded leadframe 6 and a surface 20 of the at least one electrical contact 16 of the semiconductor package 14 facing away from the main surface 8 may be flush, i.e. the surfaces 18 and 20 may be arranged in a common plane which is indicated by a horizontal dashed line.

Figures 3A, 3B, 3C, 3D, 3E, 3F, 3G:
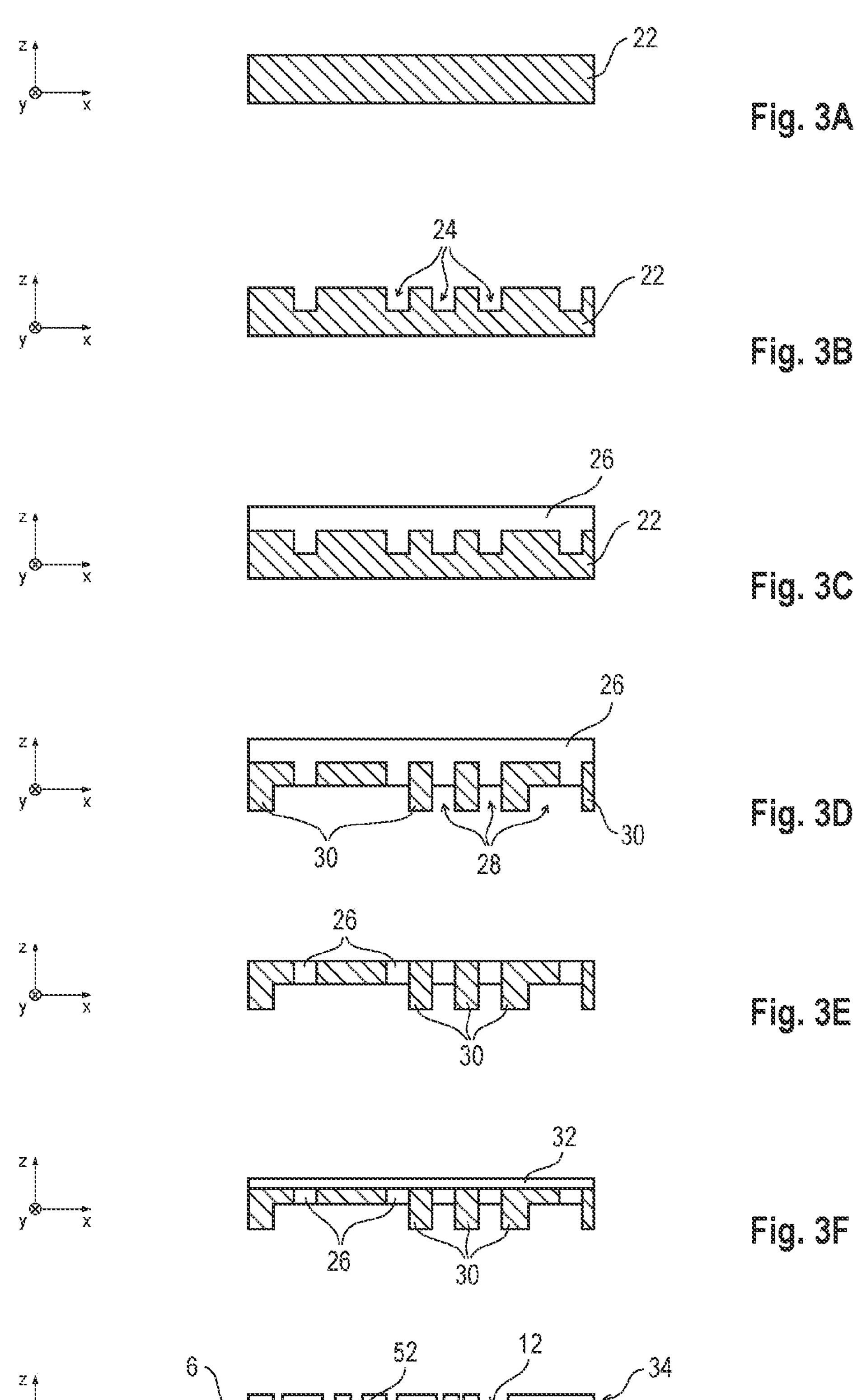
FIGS. 3A-3K schematically illustrate a cross-sectional side view of a method for manufacturing a semiconductor device 300 in accordance with the disclosure.
Figures 3H, 3I, 3J, 3K:
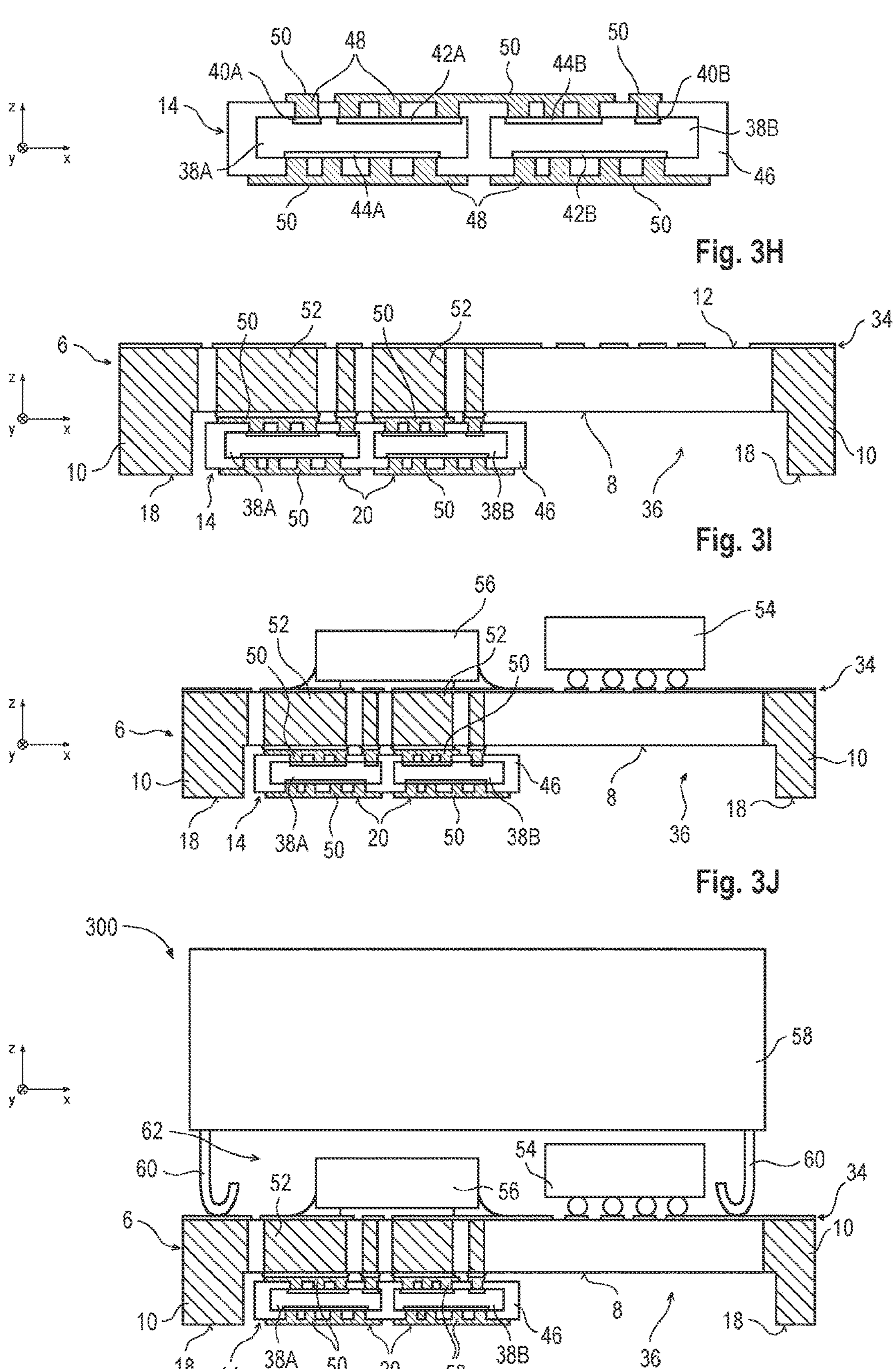

FIG. 3 includes FIGS. 3A to 3K schematically illustrating a cross-sectional side view of a method for manufacturing a semiconductor device 300 in accordance with the disclosure which is shown in FIG. 3K. The method of FIG. 3 may be seen as a more detailed version of the method of FIG. 1. In a similar fashion, the manufactured semiconductor device 300 of FIG. 3K may be seen as a more detailed version of the semiconductor device 200 of FIG. 2.

A first part of the described method is shown in FIGS. 3A to 3G and relates to the fabrication of a premolded leadframe. In FIG. 3A, an electrically conductive plate (or sheet) 22 may be provided. In the following, electrically conductive portions of the premolded leadframe that is to be fabricated are illustrated by hatched areas. The plate 22 may be made of a metal or a metal alloy, such as e.g. at least one of copper, copper alloys, nickel, iron nickel, aluminum, etc. In the example of FIG. 3A, the metal plate 22 may be made of copper or a copper alloy.

In FIG. 3B, the top surface of the metal plate 22 may be structured, thereby providing multiple recesses 24 formed in the top surface. For example, the top surface of the metal plate 22 may be structured based on an etching technique.

In FIG. 3C, the structured top surface of the metal plate 22 may be overmolded by a mold material 26, wherein the recesses 24 may be filled with the mold material 26. In this regard, various molding techniques may be used, for example at least one of compression molding, injection molding, Powder molding, liquid molding, etc. The mold material 26 may include at least one of epoxy, filled epoxy, glass fiber filled epoxy, imide, thermoplast, thermoset polymer, polymer blend, etc.

In FIG. 3D, the bottom surface of the arrangement may be structured, thereby providing multiple cavities 28 formed in the bottom surface. For example, the bottom surface may be structured based on an etching technique. When structuring the bottom surface, the metal plate 22 may be separated in multiple metal portions 30. As will become apparent later on, the metal portions 30 may become electrical contacts of the premolded leadframe that is to be manufactured.

In FIG. 3E, the mold material 26 may be partly removed from the top surface of the arrangement. For example, the mold material 26 may be grinded from the top surface until the metal portions 30 may become uncovered by the mold material 26. After partly removing the mold material 26, the top surfaces of the mold material 26 and the top surfaces of the metal portions 30 may be flush, i.e. these surfaces may be arranged in a common plane.

In FIG. 3F, a thin planar metal layer 32 may be manufactured on the top surface of the arrangement. For example, the metal layer 32 may be manufactured based on one or more of a sputtering technique or a plating technique. In one example, the metal layer 32 may include or may be made of copper and/or a copper alloy.

In FIG. 3G, the metal layer 32 may be structured such that an electrical redistribution layer 34 may be formed. When measured in the z-direction, the electrical redistribution layer 34 may have a thickness from about 2 micrometers to about 10 micrometers. Depending on the used structuring technique, electrical lines formed in the electrical redistribution layer 34 may have a lateral thickness starting from about 1 micrometer. In addition, spaces formed between the electrical lines may have a lateral thickness starting from about 1 micrometer.

The electrical redistribution layer 34 may be configured to provide an electrical connection or electrical routing between electronic components of the semiconductor device that is to be manufactured. In particular, the electrical redistribution layer 34 may be configured for a routing of logical signals. In this regard, the electrical redistribution layer 31 may have narrow pitches and may thus provide a reasonably high routing density for logic. In some cases, the electrical redistribution layer 34 may also be configured for a connection of electronic power components. In a further act (not illustrated), the electrical redistribution layer 34 may be plated to allow for at least one of soldering or wire bonding.

The arrangement of FIG. 3G may correspond to a premolded leadframe 6 which may be seen as a more detailed version of the premolded leadframe 6 of FIG. 2. The premolded leadframe 6 of FIG. 3G may include a main surface 8, one or multiple electrical contacts 10 extending out of the main surface 8, and an opposite main surface 12 arranged opposite to the main surface 8. Remaining portions of the previously structured metal plate 22 not extending out of the main surface 8 may form one or multiple electrical through connections 52 extending from the bottom main surface 8 to the top main surface 12. In FIG. 3G, the electrical redistribution layer 34 may exemplarily include one single electrically conductive layer. In further examples, the premolded leadframe 6 may include multiple electrically conductive layers stacked on top of each other as well as dielectric layers arranged between the stacked electrically conductive layers.

The electrical contacts 10 extending out of the main surface 8 may later on be configured to mechanically and electrically couple the premolded leadframe 6 to a further component, such as e.g. a printed circuit board. A size and shape of the electrical contacts 10, in particular when viewed in the z-direction, may depend on a desired electrical connection type and associated electrical current densities. In one example, the electrical contacts 10 may be associated with logic signals based on low voltages and small current densities. Here, the electrical contacts 10 may be formed as columns or pedestals having a circular or rectangular cross section. In a further example, the electrical contacts 10 may be associated with electrical power currents and high voltages. In such case, the electrical contacts 10 may have elongated shapes when viewed in the z-direction, for example bar-shaped, L-shaped, ring-shaped, etc.

The electrical contacts 10 may form side walls of cavities 36 arranged at the main surface 8. As will become apparent later on, one or multiple electronic components may be arranged in the cavities 36. When measured in the z-direction, a depth of a cavity 36 and/or a vertical dimension of the electrical contact 10 forming a side wall of the cavity 36 may be in a range from about 0.2 mm to about 2 mm. In addition, when measured in the z-direction, a thickness of the middle layer of the premolded leadframe 6, i.e. a distance from the lower main surface 8 to the upper main surface 12, may be in a range from about 100 micrometers to about 200 micrometers. As will become apparent later on, the middle layer of the premolded leadframe 6 may particularly support a high lateral electrical current conductivity.

In FIG. 3H, a semiconductor package 14 may be provided. The semiconductor package 14 may include one or multiple semiconductor chips 38. In this regard, it is to be noted that throughout this description, the terms "chip", "semiconductor chip,", "die", "semiconductor die" may be interchangeably used. In general, semiconductor chips described herein may be manufactured from an elemental semiconductor material (e.g. Si) or from a wide band gap semiconductor material or a compound semiconductor material (e.g. SiC, GaN, SiGe, GaAs). A semiconductor chip may particularly include a power semiconductor component and may thus be referred to as power semiconductor chip. Power semiconductor chips may be used in any kind of power application like e.g. MOSFETs (Metal Oxide Semiconductor Field Effect Transistors), half bridge circuits, power modules including a gate driver, etc. For example, power chips may include or may be part of a power device like e.g. a power MOSFET, an LV (low voltage) power MOSFET, a power IGBT (Insulated Gate Bipolar Transistor), a power diode, a superjunction power MOSFET, etc.

In the specific example of FIG. 3H, the semiconductor package 14 may include a first semiconductor chip 38A and a second semiconductor chip 38. The first semiconductor chip 38A may include or may correspond to a Power transistor including a gate electrode 40A and a drain electrode 42A which may be arranged on the top surface of the first semiconductor chip 38A as well as a source electrode 44A which may be arranged on the bottom surface of the first semiconductor chip 38A ("source down"). The second semiconductor chip 38B may include or may correspond to a power transistor including a gate electrode 40B and a source electrode 44B which may be arranged on the top surface of the second semiconductor chip 38B ("source up") as well as a drain electrode 42B which may be arranged on the bottom surface of the second semiconductor chip 38B.

The semiconductor package 14 may further include a dielectric material 46, such as e.g. a laminate material 46, in which the semiconductor chips 38A and 38B may be embedded. For example, the laminate material 46 may include an epoxy laminate material which may be glass-reinforced. In particular, the laminate material 46 may include an FR4 laminate or an FR4 based PCB material. In this connection, the semiconductor package 14 may be referred to as a chip embedded (CE) package. An electrically conductive material 48 is illustrated by hatched areas and may provide an electrical connection between the electrodes 40, 42, 44 of the semiconductor chips 38A, 38B and peripheral electrical contacts 50 of the semiconductor package 14. The electrodes 40, 42, 44 of the semiconductor chips 38A, 38B may be electrically accessible from outside of the laminate material 46 via the electrical contacts 50.

The electrically conductive material 48 may further provide an electrical connection between the drain electrode 42A of the first power transistor 38A and the source electrode 44B of the second power transistor 38B. The electrically connected power transistors 38A and 38B may form a half bridge circuit. In particular, the first power transistor 38A may form a low side switch of the half bridge circuit, and the second power transistor 38B may form a high side switch of the half bridge circuit. As will become apparent later on, the half bridge circuit may be part of a DC-DC converter. Note that since the gate electrode 40A and the drain electrode 42A are arranged on a same side of the first power transistor 38, no additional routing and pads in the semiconductor package 14 may be required for forming the half bridge circuit. Due to such electrode arrangement the source electrode 44B of the high side switch and the drain electrode 42A of the low side switch may already be connected on the top surface such that the semiconductor package 14 may only require one metal layer on each side.

In the example of FIG. 3H, both semiconductor chips 38A and 38B may be encapsulated in a same semiconductor package 14. In a further example, the first semiconductor chip 38A may be encapsulated in a first semiconductor package, and the second semiconductor chip 38B may be encapsulated in a separate second semiconductor package. In the example of FIG. 3H, the semiconductor chips 38A and 38B may be embedded in the laminate material 46. In a further example, the semiconductor package 14 may include a mold compound and the semiconductor chips 38A and 38B may be encapsulated in the mold compound.

In FIG. 3I, the semiconductor package 14 of FIG. 3I (or multiple semiconductor packages in other examples) may be arranged on the main surface 8 of the premolded leadframe 6 laterally displaced to the electrical contacts 10. In particular, the semiconductor package 14 may be arranged in a cavity 36, wherein electrical contacts 10 of the premolded leadframe 6 may form at least a portion of a sidewall of the cavity 36. Note that for the sake of simplicity the premolded leadframe 6 and the semiconductor package 14 of FIG. 3I are illustrated in a more qualitative and simplified manner as compared to previously described figures. However, the premolded leadframe 6 and the semiconductor package 14 of FIG. 3I may include some or all of the technical features previously described.

The electrical contacts 50 arranged on the top surface of the semiconductor package 14 may be electrically connected to the electrical redistribution layer 31 via the electrical through connections 52 extending from the bottom main surface 8 to the top main surface 12 of the premolded leadframe 6. That is, the semiconductor package 14 may be electrically accessible via the electrical redistribution layer 34. Surfaces 20 of the electrical contacts 50 arranged on the bottom surface of the semiconductor package 14 and surfaces 18 of the electrical contacts 10 of the premolded leadframe 6 may be flush, i.e. may be arranged in a common plane.

In FIG. 3J, a logic semiconductor chip 54 may be arranged over the upper main surface 12 of the premolded leadframe 6. In particular, the logic semiconductor chip 54 may be electrically connected to one or multiple portions of the electrical redistribution layer 34. Accordingly, the logic semiconductor chip 54 may be electrically accessible via the electrical redistribution layer 34. The logic semiconductor chip 54 may be configured to drive and/or control at least one of the semiconductor chips 38A and 38B. In this regard, the logic semiconductor chip 54 may also be referred to as driver semiconductor chip (or driver) or control semiconductor chip (or controller). In the example of FIG. 3J, the logic semiconductor chip 54 may be electrically coupled to the electrical redistribution layer 34 via solder balls or copper pillars based on a flip chip technique.

It is to be noted that in other examples the logic semiconductor chip 54 may be assembled differently and/or may be arranged at a different position in the arrangement. In one example, the logic semiconductor chip 54 may be electrically connected to the electrical redistribution layer 34 via wire bonds. Such assembly may provide additional routing options, but may require more space because the associated electrical connections may be located outside of the die area, i.e. outside of the footprint of the logic semiconductor chip 54. In another example, the logic semiconductor chip 54 may be arranged on the bottom main surface 8 of the premolded leadframe 6 inside the cavity 36 and may be electrically connected to one or multiple of the electrical through connections 52. Such solution may require a routing of the logic contacts of the logic semiconductor chip 54 to the electrical redistribution layer 34 through the premolded leadframe 6. In yet another example, even though preferably the semiconductor package 14 may exclusively include power semiconductor chips, the logic semiconductor chip 54 may be encapsulated in the semiconductor package 14 as well.

In FIG. 3J, one or multiple electronic components may be arranged over the upper main surface 12 of the premolded leadframe 6. In the example of FIG. 3J, a capacitor 56 may be arranged over the upper main surface 12. In further examples, the arranged electronic components may include at least one of resistors, diodes, sensors, photodiodes, LEDs, etc. It is understood that the number and type of arranged electronic components may depend on the type of the semiconductor device that is to be manufactured. The capacitor 56 in FIG. 3J may be electrically connected to the electrical redistribution layer 34. For the sake of simplicity, only one capacitor 56 is shown in FIG. 3J. The capacitor 56 may be electrically connected to the semiconductor package 14 via one or multiple of the electrical through connections 52 extending through the premolded leadframe 6.

In FIG. 3K, one or multiple inductors 58 may be arranged over the upper main surface 12 of the premolded leadframe 6. The inductor(s) 58 may be electrically connected to the electrical redistribution layer 34. For the sake of simplicity, only one inductor 58 is shown in FIG. 3K. The Inductor 58 may be electrically connected to the electrical redistribution layer 31 via one or multiple electrical connection elements 60. In the example of FIG. 3K, the electrical connection elements 60 may be bent metal elements. In further examples, the electrical connection elements 60 may include at least one of copper blocks, solder ball, copper core solder balls, etc. The electrical connection elements 60 may correspond to stand-offs which may be configured to form a gap 62 between the upper main surface 12 of the premolded leadframe 6 and the bottom surface of the inductor 58. In the example of FIG. 3K, the logic semiconductor chip 54 and the capacitor 56 may be arranged in the gap 62.

FIG. 3K illustrates the manufactured semiconductor device 300. The flush electrical contacts 10 and 50 of the premolded leadframe 6 and the semiconductor package 14 may define a footprint of the semiconductor device 300. The flush contacts may be configured to mechanically and electrically couple the semiconductor device 300 to another component (not illustrated), in particular to a printed circuit board. In one example, the semiconductor device 300 may be configured to operate as a DC-DC converter (or buck converter), wherein the half bridge circuit formed by the power transistors 38A and 38B may be part of the DC-DC converter. An exemplary circuit diagram of a DC-DC converter which may be implemented by the semiconductor device 300 is shown and described in connection with FIG. 4.

It is understood that the semiconductor device 300 may include further components which are not illustrated for the sake of simplicity. In one example, the remaining volumes of the cavity 36 and/or the gap 62 may be at least partly filled with a filling material (not illustrated). The filling material may be configured to protect the electronic components (in particular the logic semiconductor chip 54) arranged in the cavity 36 and/or in the gap 62 from damage. For example, the filling material may include one or more of an epoxy material, a mold compound, a glob-top material, etc. and may be applied based on one or more of filling, printing, molding, underfilling, dispensing, etc.

In a further example, the entire semiconductor device 300 including the premolded leadframe 6 and the inductor 58 arranged on top may be encapsulated by an additional encapsulation material (not illustrated). In this connection, the semiconductor device 300 may e.g. be overmolded by a mold material. Here, at least the electrical contacts 10 and 50 of the premolded leadframe 6 and the semiconductor package 14 may protrude out of a bottom surface of a housing formed by the additional encapsulation material. This way, the encapsulated components may be electrically accessible from outside of the housing.

The semiconductor device 300 may outperform conventional semiconductor devices having similar functionalities with regard to space requirements. Some conventional semiconductor devices may include integrated half bridges with associated passive electronic components arranged next to them in a side by side manner on a printed circuit board. Further conventional semiconductor devices may correspond to leadframe based QFN (Quad Flat No Leads) packages. In still further conventional semiconductor devices, an included semiconductor package may be embedded in a printed circuit board. Compared to all of these conventional approaches, semiconductor devices in accordance with the disclosure may have a reduced size, in particular when including an inductor which may represent the largest component of the semiconductor device. Reducing the size of the device and the required board area may result in reduced costs.

Arranging the semiconductor package 14 in the cavity 36 of the premolded leadframe 6, combined with stacking the inductor 58 on the top surface of the premolded leadframe 6, and even further combined with the logic semiconductor chip 54 and the capacitor 56 being arranged in the gap 62, may provide a particularly compact semiconductor device in accordance with the disclosure. The semiconductor device 300 may provide a highly efficient SiP (System-in-Package) solution with a very small outline, such as e.g. a size efficient DC-DC converter which may be used in a server application. In this regard, each of the semiconductor devices in accordance with the disclosure as described herein may be referred to as a System-in-Package.

Figure 4:
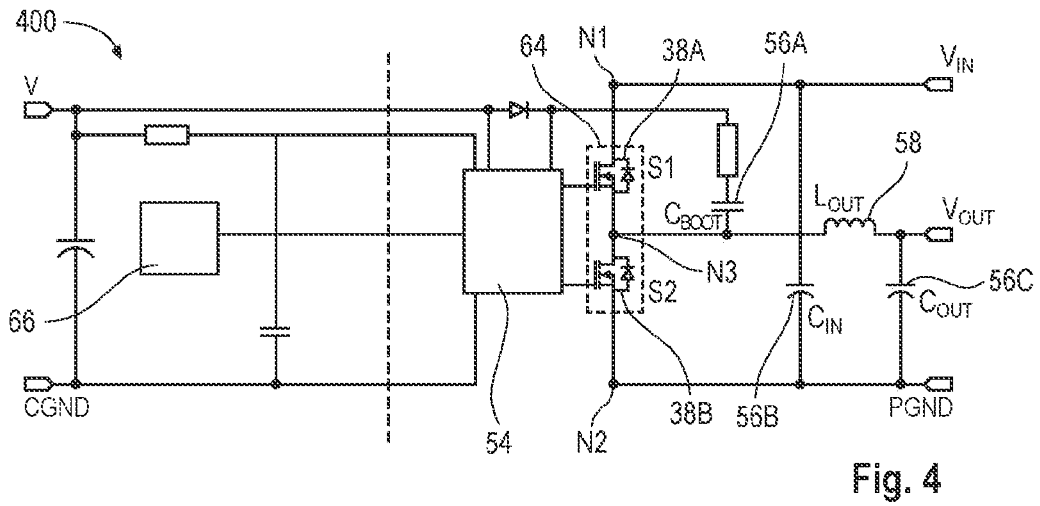
FIG. 4 illustrates a diagram of a circuitry 400 which may be at least partly implemented in a semiconductor device in accordance with the disclosure.

FIG. 4 illustrates a diagram of a circuitry 400 which may be at least partly implemented in a semiconductor device in accordance with the disclosure. For example, the circuitry 400 may be at least partly implemented in the semiconductor device 300 of FIG. 3K. The circuitry 400 or at least a part thereof may be configured to operate as a DC-DC converter. DC-DC converters may be used to convert a DC input voltage $V_{IN}$ provided by e.g. a battery into a DC output voltage $V_{OUT}$ matched to the demand of e.g. electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

The circuitry 400 may include an input at which an input voltage $V_{IN}$ may be applied and an output at which an output voltage $V_{OUT}$ may be provided. Further, the circuitry 400 may include a driver (or control) circuit which may be implemented in a logic semiconductor chip 54 as well as a first power transistor 38A and a second power transistor 38B which may form a half bridge circuit 64. The circuitry 400 may further include an inductor 58 (see $L_{OUT}$) and capacitors 56A (see $C_{BOOT}$), 56B (see $C_{IN}$) and 56C (see $C_{OUT}$). The circuitry 400 may include further electronic components (such as e.g. capacitors, resistors, diodes) and a PWM (Pulse Width Modulation) controller 66, which may be exemplarily arranged as shown in FIG. 4. In particular, components of the circuitry 400 arranged to the right of a vertical dashed line may be configured to operate as a DC-DC converter. The components of such DC-DC converter may be implemented in a semiconductor device in accordance with the disclosure, for example in the semiconductor device 300 of FIG. 3K.

The first power transistor 38A and the second power transistor 38B may be connected in series and may be configured to operate as switches S1 and S2 of the half bridge circuit 64 arranged between nodes N1 and N2. The driver circuit 54 may be configured to drive at least one of the first power transistor 38A and the second power transistor 38B. In particular, the driver circuit 54 may be configured to drive the gate electrodes of the power transistors 38A and 38B and may thus be referred to as a gate driver.

Constant electrical potentials may be applied to the nodes N1 and N2. For example, a high potential, such as e.g. 6 V, 10 V, 12 V, 18 V, 50 V, 110 V, 230 V, 500 V or 1000 V or any other potential, may be applied to the node N1 and a low electrical potential, for example 0 V, may be applied to the node N2. The switches S1 and S2 may be switched at frequencies in a range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

Figure 5:
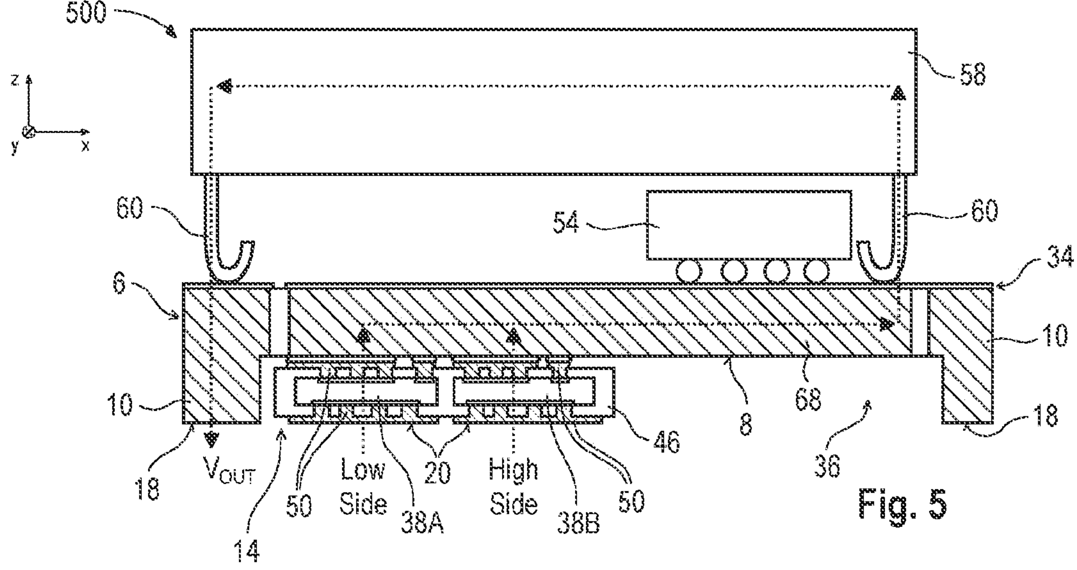
FIG. 5 schematically illustrates a cross-sectional side view of a semiconductor device 500 in accordance with the disclosure.

FIG. 5 schematically illustrates a cross-sectional side view of a semiconductor device 500 in accordance with the disclosure. The semiconductor device 500 may be at least partly similar to the semiconductor device 300 of FIG. 3K. In contrast to FIG. 3K, the capacitor 56 is not illustrated and the conductive portions of the premolded leadframe 6 may be arranged differently. In addition, a detailed structure of the electrical redistribution layer 34 is omitted for the sake of simplicity.

The logic semiconductor chip 54 and associated logic pads may be arranged at the right edge of the semiconductor device 500. Such arrangement may be preferable for a board mounting of the semiconductor device 500. Since the inductor 58 may span components of the semiconductor device 500, the $V_{OUT}$ potential may be arranged on the opposite left edge of the semiconductor device 500. The input side of the inductor 58 on the right may be arranged close to the logic pads associated with the logic semiconductor chip 54.

A current flow through the semiconductor device 500 is indicated by dotted arrows. For example, the current flow of FIG. 5 may be read in connection with the circuitry 400 of FIG. 4. A high current may be output by the half bridge circuit including the high side switch and the low side switch and may be routed through an electrically conductive portion 68 of the premolded leadframe 6 extending in a lateral direction. When measured in the z-direction, the portion 68 may e.g. have a dimension of greater than about 100 micrometers. The portion 68 may therefore be configured to carry high currents output by the power transistors 38A and 38B. Due to a high current carrying capability of the portion 68 in the lateral direction, the semiconductor device 500 may outperform conventional semiconductor devices which can only provide a lateral current transmission via electrical redistribution layers having a very low thickness. After passing the inductor 58 the current is routed to the output $V_{OUT}$.

Figure 6:
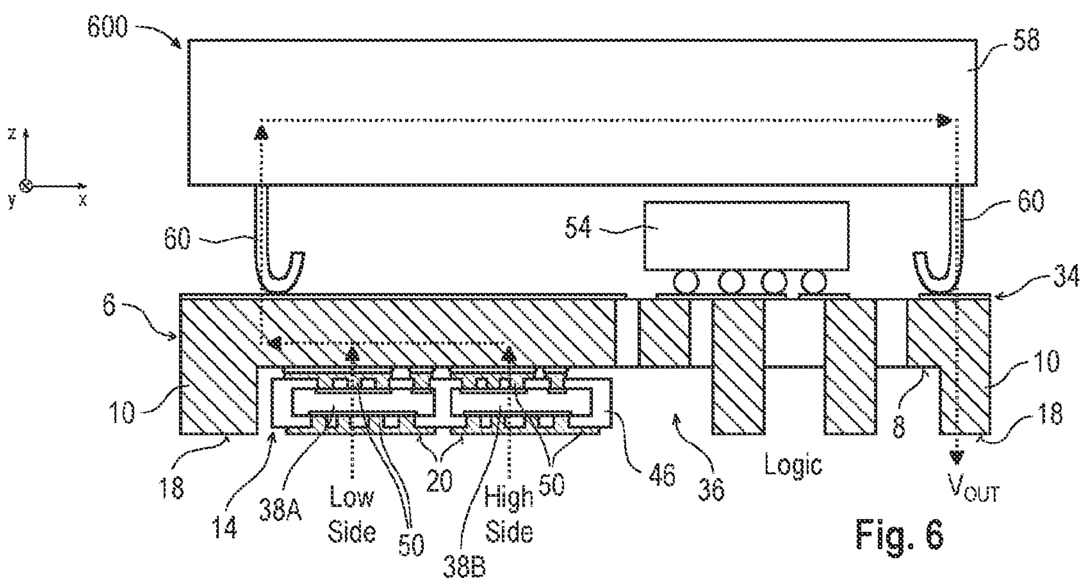
FIG. 6 schematically illustrates a cross-sectional side view of a semiconductor device 600 in accordance with the disclosure.

FIG. 6 schematically illustrates a cross-sectional side view of a semiconductor device 600 in accordance with the disclosure. The semiconductor device 600 may be at least partly similar to the semiconductor device 500 of FIG. 5. Compared to FIG. 5, the assignment of the inductor 58 may be changed. In particular, the input and the output of the inductor 58 may be inverted. The logic contacts are routed to pads which are not arranged at the short side of the semiconductor device 600. Such arrangement may allow for a straight forward routing inside the semiconductor device 600. Compared to FIG. 5, the outline or footprint of the semiconductor device 600 may be reduced and its efficiency may be increased. In a further example (not illustrated), the contact for $V_{OUT}$ may be arranged at the top side of the Inductor 58 and may be connected by a current load. An additional contact configured to bring the current backward from the top may be present or not.

In the following, a routing of potentials in semiconductor devices in accordance with the disclosure is described. As already specified in connection with the circuitry 400 of FIG. 4, a semiconductor device in accordance with the disclosure may operate as a DC-DC converter including various capacitors. Some capacitors may connect so potentials which may be available at the electrical redistribution layer 34 arranged at the top main surface 12 of the premolded leadframe 6, such as e.g. the capacitor 56A (see $C_{BOOT}$) of FIG. 4. Other capacitors, such as e.g. the capacitor 56B of FIG. 4 (see $C_{IN}$), may need to connect to potentials which may only be available at the footprint, i.e. the bottom surface, of the semiconductor device. It may thus be necessary to route such potentials through the semiconductor package 14 and the premolded leadframe 6 in order to provide the potentials at the top main surface 12 of the premolded leadframe 6. Exemplary approaches for routing the potentials are shown and discussed in connection with FIGS. 7 to 9.

FIG. 7A schematically illustrates a bottom view of a semiconductor package 700 which may be included in a semiconductor device in accordance with the disclosure. FIG. 7B illustrates a top view of the same semiconductor package 700. The semiconductor package 700 may be at least partly similar to semiconductor packages described in connection with previous figures. Referring back to FIG. 3H, the bottom view of FIG. 7A shows a footprint of the semiconductor package 700 including a source contact 50A and a drain contact 50B of a half bridge circuit. The top view of FIG. 7B shows an electrical connection 70 between the drain contact of the first power transistor 38A and the source contact of the second power transistor 38B. The top view of FIG. 70 further illustrates a qualitative sketch of logical connections (e.g. including a gate connection) arranged next to the electrical connection 70. A capacitor 56B may be arranged on the electrical redistribution layer on top of the premolded leadframe.

In order to provide a routing of potentials for the capacitor 56B, the source contact 50A and the drain contact 50B may include portions 74A and 74B extending over the edges of the power transistors 38A and 38B. When viewed in the z-direction, the capacitor 56B may be placed with its center between the power transistors 38A and 38B. Via connections 76 providing an electrical connection in the z-direction may be placed between the power transistors 38A and 38B in order to connect the required potentials to the capacitor 56B. The approach of FIG. 7 may provide a good positioning of the capacitor 56B at the cost of a higher distance between the high side switch and the low side switch of the half bridge circuit.

In the example of FIG. 8, the capacitor 56B may be arranged substantially outside of the footprint of the electrical connection 70. In particular, the capacitor 56B may be arranged at the side of the high side switch which may be smaller compared to the low side switch. The approach of FIG. 8 may provide a minimum distance of the power switches of the half bridge circuit at the cost of a slightly less optimal position of the capacitor 56B.

In the example of FIG. 9, the potentials may be provided to the capacitor 56B by means of insulated through silicon connections 78 extending from one side of the semiconductor chip to the opposite side with a separate pad on the top side. The approach of FIG. 9 may provide a small distance between the power transistors 38A and 38B and a good positioning of the capacitor 56B at the cost of additional chip area.

EXAMPLES

In the following, semiconductor devices and methods for manufacturing such semiconductor devices in accordance with the disclosure will be explained by means of examples.

Example 1 is a semiconductor device, comprising: a premolded leadframe, comprising a main surface, at least one electrical contact extending out of the main surface, and an opposite main surface arranged opposite to the main surface; and a semiconductor package arranged on the main surface and laterally displaced to the at least one electrical contact of the premolded leadframe, wherein the semiconductor package comprises a semiconductor chip and at least one electrical contact, wherein surfaces of the at least one electrical contact of the premolded leadframe and the at least one electrical contact of the semiconductor package facing away from the main surface are flush.

Example 2 is a semiconductor device according to Example 1, wherein: the premolded leadframe comprises a cavity, the at least one electrical contact of the premolded leadframe forms at least a portion of a sidewall of the cavity, and the semiconductor package is arranged in the cavity.

Example 3 is a semiconductor device according to Example 1 or 2, wherein the electrical contacts of the premolded leadframe and the semiconductor package are configured to mechanically and electrically couple the semiconductor device to a printed circuit board.

Example 4 is a semiconductor device according to one of the preceding Examples, wherein the semiconductor package comprises a laminate material and the semiconductor chip is encapsulated in the laminate material.

Example 5 is a semiconductor device according to one of Examples 1 to 3, wherein the semiconductor package comprises a mold compound and the semiconductor chip is encapsulated in the mold compound.

Example 6 is a semiconductor device according to one of the preceding Examples, further comprising: a further semiconductor chip, wherein the further semiconductor chip is encapsulated in the semiconductor package or in a further semiconductor package arranged on the main surface.

Example 7 is a semiconductor device according to Example 6, wherein each of the semiconductor chips comprises a power transistor.

Example 8 is a semiconductor device according to Example 7, wherein the power transistors form a high side switch and a low side switch of a half bridge circuit.

Example 9 is a semiconductor device according to Example 8, wherein: the semiconductor device is configured to operate as a DC-DC converter, and the half bridge circuit is Part of the DC-DC converter.

Example 10 is a semiconductor device according to one of Examples 7 to 9, wherein the premolded leadframe comprises a portion extending in a lateral direction, wherein the portion is configured to carry an electric current output by at least one of the power transistors.

Example 11 is a semiconductor device according to one of the preceding Examples, wherein the premolded leadframe comprises an electrical redistribution layer arranged on the opposite main surface of the premolded leadframe.

Example 12 is a semiconductor device according to Example 11, wherein the electrical redistribution layer is configured for a routing of logical signals.

Example 13 is a semiconductor device according to one of the preceding Examples, further comprising: a logic semiconductor chip configured to drive and/or control at least the semiconductor chip.

Example 14 is a semiconductor device according to Example 13, wherein the logic semiconductor chip is arranged on the opposite main surface of the premolded leadframe.

Example 15 is a semiconductor device according to Example 13, wherein the logic semiconductor chip is encapsulated in the semiconductor package.

Example 16 is a semiconductor device according to one of the preceding Examples, further comprising: at least one passive electronic component arranged on the opposite main surface of the premolded leadframe.

Example 17 is a semiconductor device according to Example 16, wherein the at least one passive electronic component comprises an inductor.

Example 18 is a semiconductor device according to Example 17, further comprising: a stand-off configured to form a gap between the opposite main surface of the premolded leadframe and the inductor.

Example 19 is a semiconductor device according to Example 18 and Example 13, wherein the logic semiconductor chip is arranged in the gap.

Example 20 is a semiconductor device according to Examples 16 to 19, wherein the at least one passive electronic component comprises at least one capacitor.

Example 21 is a semiconductor device according to Example 20 and Example 18, wherein the at least one capacitor is arranged in the gap.

Example 22 is a semiconductor device according to Example 2 and/or Example 18, further comprising: a filling material at least partly filling the cavity and/or the gap.

Example 23 is a method for manufacturing a semiconductor device, the method comprising providing a premolded leadframe, comprising a main surface, at least one electrical contact extending out of the main surface, and an opposite main surface arranged opposite to the main surface; and arranging a semiconductor package on the main surface and laterally displaced to the at least one electrical contact of the premolded leadframe, wherein the semiconductor package comprises a semiconductor chip and at least one electrical contact, wherein surfaces of the at least one electrical contact of the premolded leadframe and the at least one electrical contact of the semiconductor package facing away from the main surface are flush.

As employed in this specification, the terms “connected”, “coupled”, “electrically connected”, and/or “electrically coupled” may not necessarily mean that elements must be directly connected or coupled together. Intervening elements may be provided between the “connected”, “coupled”, “electrically connected”, or “electrically coupled” elements.

Further, the word “over” used with regard to e.g. a material layer formed or located “over” a surface of an object may be used herein to mean that the material layer may be located (e.g. formed, deposited, etc.) “directly on”, e.g. in direct contact with, the implied surface. The word “over” used with regard to e.g. a material layer formed or located “over” a surface may also be used herein to mean that the material layer may be located (e.g. formed, deposited, etc.) “indirectly on” the implied surface with e.g. one or multiple additional layers being arranged between the implied surface and the material layer.

Furthermore, to the extent that the terms “having”, “containing”, “including”, “with”, or variants thereof are used in either the detailed description or the claims, such terms are intended to be inclusive in a manner similar to the term “comprising”. That is, as used herein, the terms “having”, “containing”, “including”, “with”, “comprising”, and the like are open-ended terms that indicate the presence of stated elements or features, but do not preclude additional elements or features. The articles “a”, “an”, and “the” are intended to include the plural as well as the singular, unless the context clearly indicates otherwise.

Moreover, the word “exemplary” is used herein to mean serving as an example, instance, or illustration. Any aspect or design described herein as “exemplary” is not necessarily to be construed as advantageous over other aspects or designs. Rather, use of the word exemplary is intended to present concepts in a concrete fashion. As used in this application, the term “or” is intended to mean an inclusive “or” rather than an exclusive “or”. That is, unless specified otherwise, or clear from context, “X employs A or B” is intended to mean any of the natural inclusive permutations. That is, if X employs A; X employs B; or X employs both A and B, then “X employs A or B” is satisfied under any of the foregoing instances. In addition, the articles “a” and “an” as used in this application and the appended claims may generally be construed to mean “one or multiple” unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A semiconductor device, comprising:

a premolded leadframe, comprising a main surface, at least one electrical contact extending out of the main surface, and an opposite main surface arranged opposite to the main surface; and a semiconductor package arranged on the main surface and laterally displaced to the at least one electrical contact of the premolded leadframe, wherein the semiconductor package comprises a semiconductor chip and at least one electrical contact, wherein surfaces of the at least one electrical contact of the premolded leadframe and the at least one electrical contact of the semiconductor package facing away from the main surface are flush, wherein the premolded leadframe comprises:

an electrically conductive plate that is formed from a metal or a metal alloy; and regions of electrically insulating mold material, wherein the regions of electrically insulating mold material are arranged within openings that extend completely through a thinner part of the electrically conductive plate.

2. The semiconductor device of claim 1, wherein:

the premolded leadframe comprises a cavity, the at least one electrical contact of the premolded leadframe forms at least a portion of a sidewall of the cavity, and the semiconductor package is arranged in the cavity.

3. The semiconductor device of claim 1, wherein the electrical contacts of the premolded leadframe and the semiconductor package are configured to mechanically and electrically couple the semiconductor device to a printed circuit board.

4. The semiconductor device of claim 1, wherein the semiconductor package comprises a laminate material and the semiconductor chip is encapsulated in the laminate material.

5. The semiconductor device of claim 1, wherein the semiconductor package comprises a mold compound and the semiconductor chip is encapsulated in the mold compound.

6. The semiconductor device of claim 1, further comprising:

a further semiconductor chip, wherein the further semiconductor chip is encapsulated in the semiconductor package or in a further semiconductor package arranged on the main surface.

7. The semiconductor device of claim 6, wherein each of the semiconductor chip and the further semiconductor chip comprise a power transistor.

8. The semiconductor device of claim 7, wherein the power transistors form a high side switch and a low side switch of a half bridge circuit.

9. The semiconductor device of claim 8, wherein:

the semiconductor device is configured to operate as a DC-DC converter, and the half bridge circuit is part of the DC-DC converter.

10. The semiconductor device of claim 7, wherein the premolded leadframe comprises a portion extending in a lateral direction, wherein the portion is configured to carry an electric current output by at least one of the power transistors.

11. The semiconductor device of claim 1, wherein the premolded leadframe comprises an electrical redistribution layer arranged on the opposite main surface of the premolded leadframe.

12. The semiconductor device of claim 11, wherein the electrical redistribution layer is configured for a routing of logical signals.

13. The semiconductor device of claim 1, further comprising:

a logic semiconductor chip configured to drive and/or control at least the semiconductor chip.

14. The semiconductor device of claim 13, wherein the logic semiconductor chip is arranged on the opposite main surface of the premolded leadframe.

15. The semiconductor device of claim 13, wherein the logic semiconductor chip is encapsulated in the semiconductor package.

16. The semiconductor device of claim 1, further comprising:

at least one passive electronic component arranged on the opposite main surface of the premolded leadframe.

17. The semiconductor device of claim 16, wherein the at least one passive electronic component comprises an inductor.

18. The semiconductor device of claim 2, further comprising:

a filling material at least partly filling the cavity and/or the gap.

19. The semiconductor device of claim 1, wherein the least one electrical contact is formed from a thicker portion of the electrically conductive plate that protrudes away from the thinner part of the electrically conductive plate.

20. A semiconductor device, comprising:

a premolded leadframe, comprising a main surface, at least one electrical contact extending out of the main surface, and an opposite main surface arranged opposite to the main surface;

a semiconductor package arranged on the main surface and laterally displaced to the at least one electrical contact of the premolded leadframe, wherein the semiconductor package comprises a semiconductor chip and at least one electrical contact;

at least one passive electronic component arranged on the opposite main surface of the premolded leadframe; and a stand-off configured to form a gap between the opposite main surface of the premolded leadframe and the inductor, wherein surfaces of the at least one electrical contact of the premolded leadframe and the at least one electrical contact of the semiconductor package facing away from the main surface are flush, and wherein the at least one passive electronic component comprises an inductor.

21. The semiconductor device of claim 20, wherein the logic semiconductor chip is arranged in the gap.

22. The semiconductor device of claim 20, wherein the at least one passive electronic component comprises at least one capacitor.

23. The semiconductor device of claim 20, wherein the at least one capacitor is arranged in the gap.

* * * * *